US010944237B2

(12) United States Patent
Victoria

(10) Patent No.: US 10,944,237 B2
(45) Date of Patent: Mar. 9, 2021

(54) LASER PROJECTION MODULE

(71) Applicant: JABIL INC., St. Petersburg, FL (US)

(72) Inventor: Lorito Victoria, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 0 days.

(21) Appl. No.: 15/562,395

(22) PCT Filed: Mar. 28, 2016

(86) PCT No.: PCT/US2016/024516
§ 371 (c)(1),
(2) Date: Sep. 27, 2017

(87) PCT Pub. No.: WO2016/160704
PCT Pub. Date: Oct. 6, 2016

(65) Prior Publication Data
US 2018/0287336 A1  Oct. 4, 2018

Related U.S. Application Data

(60) Provisional application No. 62/139,409, filed on Mar. 27, 2015.

(51) Int. Cl.
| H01S 5/022 | (2006.01) |
| H01S 5/14 | (2006.01) |
| H01S 5/024 | (2006.01) |
| H01S 5/02216 | (2021.01) |
| H01S 5/00 | (2006.01) |

(52) U.S. Cl.
CPC ...... *H01S 5/02276* (2013.01); *H01S 5/02236* (2013.01); *H01S 5/02256* (2013.01); *H01S 5/141* (2013.01); *H01S 5/005* (2013.01); *H01S 5/0071* (2013.01); *H01S 5/0224* (2013.01); *H01S 5/02216* (2013.01); *H01S 5/02244* (2013.01); *H01S 5/02288* (2013.01); *H01S 5/02469* (2013.01)

(58) Field of Classification Search
CPC ............. H01S 5/02276; H01S 5/02256; H01S 5/0425; H01S 5/02288; H01S 5/02469; H01S 5/02244; H01S 5/141
See application file for complete search history.

(56) References Cited

U.S. PATENT DOCUMENTS 5,905,750 A * 5/1999 Lebby ................. H01S 5/02296
369/121
2002/0196820 A1* 12/2002 Sato ..................... H01S 5/02252
372/29.02

(Continued)

*Primary Examiner* — Yuanda Zhang
(74) *Attorney, Agent, or Firm* — Thomas J. McWilliams; Barnes & Thornburg LLP

(57) ABSTRACT

A laser projection module, that may include a laser projection module cover comprising a top portion, a bottom portion and a one or more of side portions to define a cavity within the cover, wherein the top portion is configured to couple an optical lens. A lead frame may be at least partially integrated into the bottom cover portion of the laser projection module, where the lead frame includes an outer lead frame portion and an inner lead frame portion relative to the cover, wherein the inner lead frame portion is configured to couple a laser diode assembly in one area of the inner lead frame portion within the cavity.

13 Claims, 12 Drawing Sheets

(56) References Cited

U.S. PATENT DOCUMENTS

| | | | | |
|---|---|---|---|---|
| 2003/0031429 A1* | 2/2003 | Okayasu | ............... | G11B 7/12 |
| | | | | 385/92 |
| 2004/0165840 A1* | 8/2004 | Kato | ............... | G02B 6/3865 |
| | | | | 385/92 |
| 2006/0051033 A1* | 3/2006 | Tabata | ............... | G02B 6/4206 |
| | | | | 385/93 |
| 2011/0102914 A1* | 5/2011 | Steegmuller | ............... | G02B 3/04 |
| | | | | 359/719 |
| 2011/0149565 A1* | 6/2011 | Marson | ............... | G02B 19/0066 |
| | | | | 362/235 |
| 2013/0272329 A1* | 10/2013 | Auen | ............... | H01S 5/024 |
| | | | | 372/34 |
| 2015/0255949 A1* | 9/2015 | Lee | ............... | H01S 5/024 |
| | | | | 372/36 |
| 2017/0153400 A1* | 6/2017 | Kasai | ............... | G02B 6/42 |

* cited by examiner

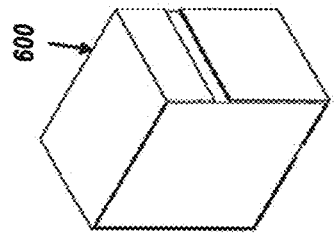
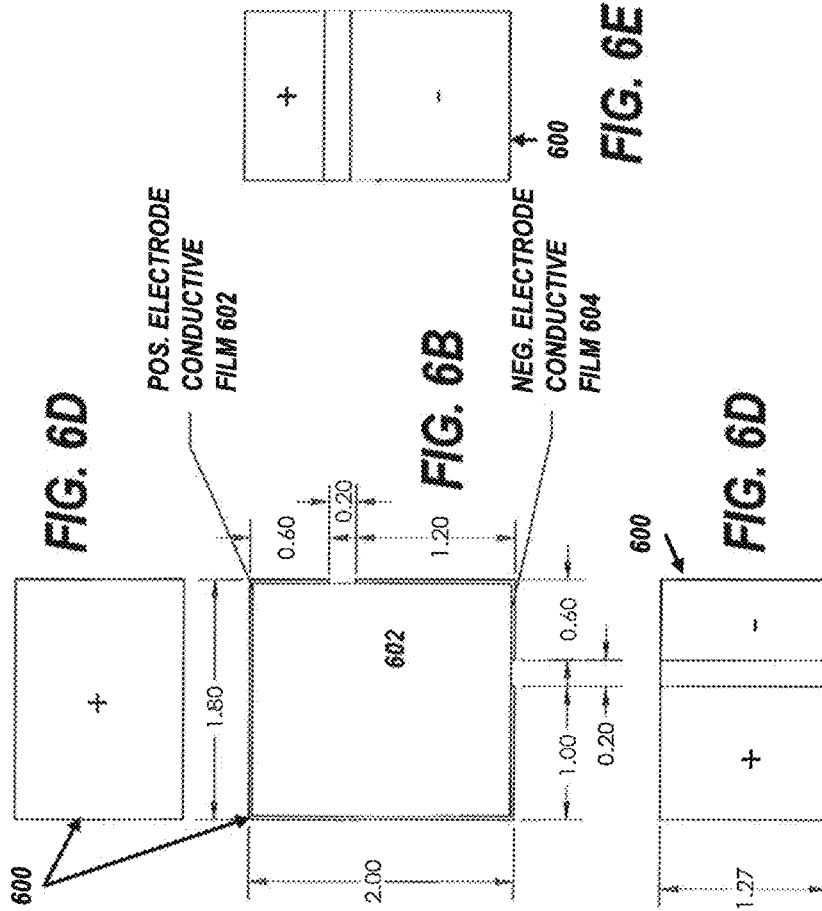
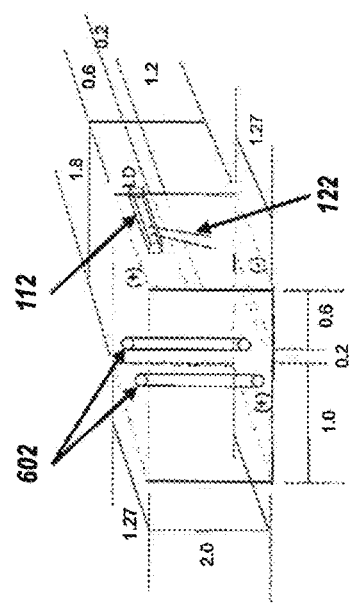

LASER PROJECTION MODULE

CROSS-REFERENCE TO RELATED APPLICATIONS

The present disclosure claims priority to PCT Application No. PCT/US16/24516, entitled: "LASER PROJECTION MODULE," filed Mar. 28, 2016, and U.S. Provisional Application No. 62/139,409, entitled "LASER PROJECTION MODULE," filed Mar. 27, 2015, the contents of which is incorporated by reference in its entirety herein.

FIELD OF THE DISCLOSURE

The present disclosure is directed to an apparatus, system and method for a laser projection module. More specifically, the present disclosure is directed to an apparatus, system and method for a laser projection module for a 3-dimensional (3D) scanning device that comprises a simplified configuration having improved manufacturability.

BACKGROUND

Laser scanning involves the controlled deflection of laser beams, whether visible or invisible, where scanned laser beams are used in stereolithography machines, in rapid prototyping, in machines for material processing, in laser engraving machines, in ophtalmological laser systems for the treatment of presbyopia, in confocal microscopy, in laser printers, in laser shows, in Laser TV, in LIDAR, and in barcode scanners, among others. Laser scanning may also involve the controlled steering of laser beams followed by a distance measurement at every pointing direction. Often referred to as 3D object scanning or 3D laser scanning, this technology is used to rapidly capture shapes of objects, buildings and landscapes. A laser rangefinder is a device which uses a laser beam to determine the distance to an object.

Laser scanners typically use moveable mirrors to steer the laser beam. The steering of the beam can be one-dimensional, two-dimensional (2D) or three-dimensional (3D). For 3D steering or focus positioning, this may be done using a servo-controlled lens system, or a "focus shifter" or "z-shifter". Additionally, the mirrors of a laser scanner can be subjected to periodic motion (e.g., rotating mirror polygons in a barcode scanner or resonant galvanometer scanners) or to a freely addressable motion (e.g., servo-controlled galvanometer scanners). To control the scanning motion, scanners typically use a rotary encoder and control electronics that provide, for a desired angle or phase, the suitable electrical current to the motor or galvanometer. A software system usually controls the scanning motion and, if 3D scanning is implemented, also the collection of the measured data.

Some of the issues with conventional laser module design is that it is expensive and requires a complicated printed circuit board assembly (PCBA) and interconnection that requires custom-designed fixtures, tools and equipment. As such, conventional laser module designs have excessively long cycle times with a complicated process flow, and is not conducive to full automation. Therefore, the need exists for an apparatus, system and method of efficiently and simply configuring laser module designs for simplified fabrication that may be fully automated.

SUMMARY

Accordingly, in some illustrative embodiments, an apparatus, system and method are disclosed for a laser projection module, comprising a laser projection module cover comprising a top portion, a bottom portion and a one or more of side portions to define a cavity within the cover, wherein the top portion is configured to couple an optical lens; and a lead frame, at least partially integrated into a bottom cover portion of the laser projection module, the lead frame comprising an outer lead frame portion and an inner lead frame portion relative to the cover, wherein the inner lead frame portion is configured to couple a laser diode assembly in one area of the inner lead frame portion within the cavity. The laser projection module may further comprise a diffractive optical element coupled to the top portion of the laser projection module cover and beneath the optical lens, as well as a lens and mirror/prism configured to receive light emission from the lens and reflect the received light to the optical lens.

In some illustrative embodiments, the laser diode assembly comprises a laser diode, a chip on sub-mount portion, a heat sink and a die attach pad portion, and the laser diode assembly may be wire bonded to the inner lead frame portion. The heat sink of the laser diode assembly may also be configured to be inside or outside of the laser projection module cover. In some illustrative embodiments, the laser diode assembly comprises a laser diode coupled to a laser diode sub-mount coupled to a die attach pad portion within the cavity of the cover.

Accordingly, the disclosed embodiments provide an apparatus, system and method of improving the manufacture of laser projection modules and devices. These embodiments may provide functional improvement over the known art, and may provide other advantageous features that will be made more apparent from the Detailed Description, below.

BRIEF DESCRIPTION OF THE FIGURES

The present disclosure will become more fully understood from the detailed description given herein below and the accompanying drawings which are given by way of illustration only, and which thus do not limit the present disclosure, and wherein:

FIGS. 6A-6F illustrate various embodiments of a sub-mount for use in a laser projection module configured to receive a laser diode;

DETAILED DESCRIPTION

Figure 1:
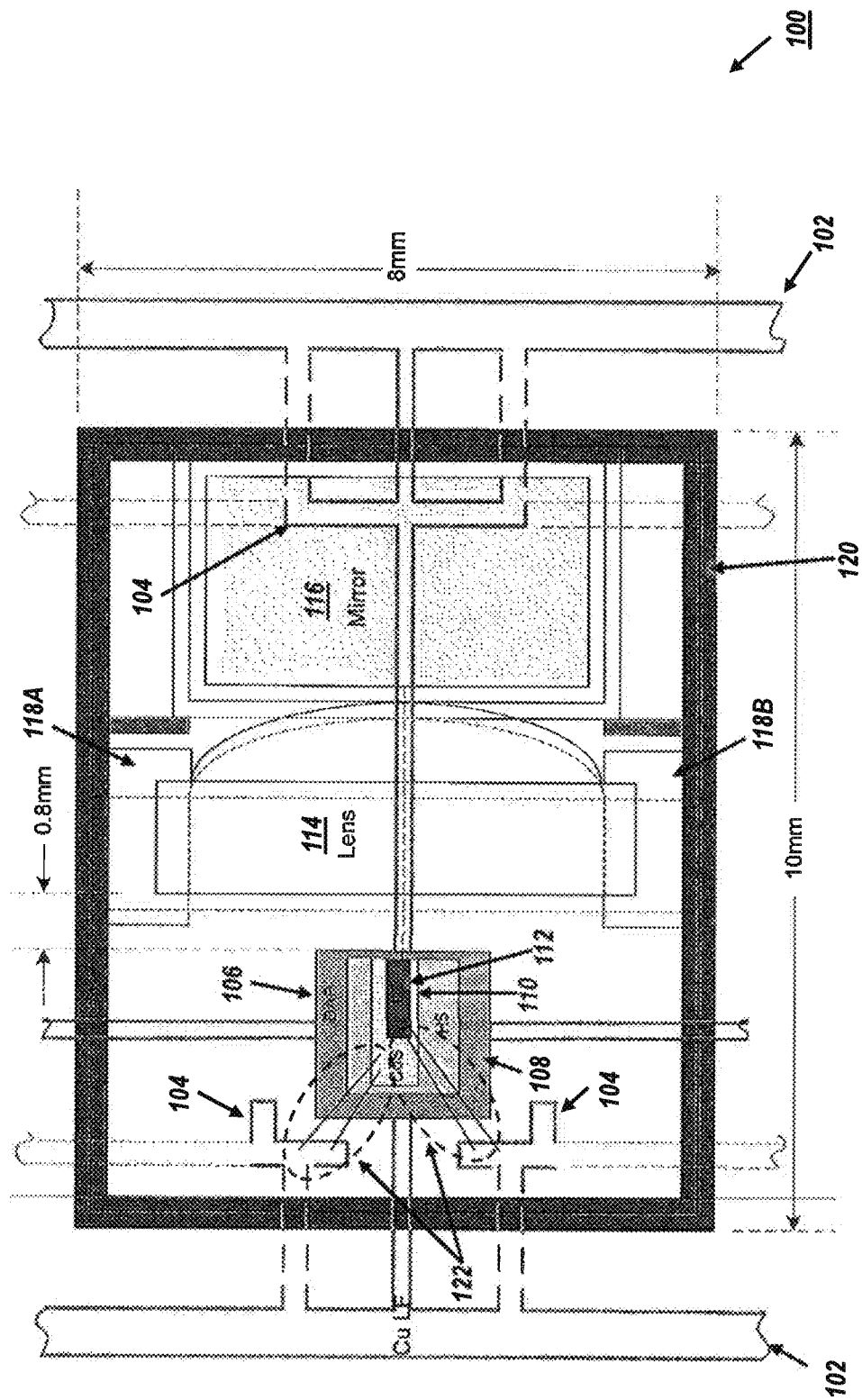
FIG. 1 shows a top view of a laser projection module comprising a lead frame, cover and laser projection components under an illustrative embodiment.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Illustrative embodiments are provided throughout so that this disclosure is sufficiently thorough and fully conveys the scope of the disclosed embodiments to those who are skilled in the art. Numerous specific details are set forth, such as examples of specific components, devices, and methods, to provide this thorough understanding of embodiments of the present disclosure. Nevertheless, it will be apparent to those skilled in the art that specific disclosed details need not be employed, and that illustrative embodiments may be embodied in different forms. As such, the illustrative embodiments should not be construed to limit the scope of the disclosure. In some illustrative embodiments, well-known processes, well-known device structures, and well-known technologies may not be described in detail.

The terminology used herein is for the purpose of describing particular illustrative embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the illustrative embodiments.

Furthermore, it should be appreciated by those skilled in the art that, while certain illustrations and disclosures herein may provide specific numbers, values, dimensions and/or ranges, they are provided merely for the purposes of illustration only, and are not intended to be limiting, and that any suitable alternate and/or additional numbers, values, dimensions and/or ranges may be used for other applications without deviating from the scope of the present disclosure.

Referring now to FIG. 1, a laser projection module assembly 100 is shown under an illustrative embodiment, comprising a cover 120 and a lead frame (e.g., 900, see FIG. 9) having an outer lead frame portion 102 that is configured outside of the cover 120, and an inner lead frame portion 104 that is configured inside the cover 120. In one embodiment, the lead frame (102-104) may comprise a copper lead frame with a nickel-palladium (NiPd) plating. As can be seen from the figure, the inner lead frame portion 104 may be configured as a meandering frame that has a frame portion coupled to a light diode assembly, which, in the example of FIG. 1, comprises die attach pad (DAP) portion 106, overlaid by heat sink 108 and chip on sub-mount (CoS) portion 110, which is configured to receive laser diode 112.

The laser diode 112 and CoS portion 110 may be electrically connected via wire-bonding (122) to the inner lead frame portion 104. Lens 114, may be coupled to the assembly 100 via mounts 118A and 118B, and is configured to pass light emission from laser diode 112 to mirror 116, for reflection outside the cover 120 of assembly 100. In some illustrative embodiments, inner lead frame portion 104 may include dummy leads extending from the sides of the cover 120 (shown as dotted lines extending from inner lead frame portions 104).

In some illustrative embodiments, the laser projection module 100 may be miniaturized for use in small or portable devices, such as smart phones. In one example, the dimensions (H×L×W) of the components may be as follows, where the laser diode 112 has the dimension (0.14×1.0×0.225 mm), CoS portion 110 has the dimension of (0.23×1.60×0.65 mm), heat sink 108 may have the dimension (2.0×2.2×1.8 mm), the DAP portion 106 has the dimension (0.025×2.2×3.0 mm), the mirror has the dimension (0.3×2.2×4.8 mm) and the lens 114 has the dimension (3.8 mm×2.7×6.3 mm).

Figure 2:
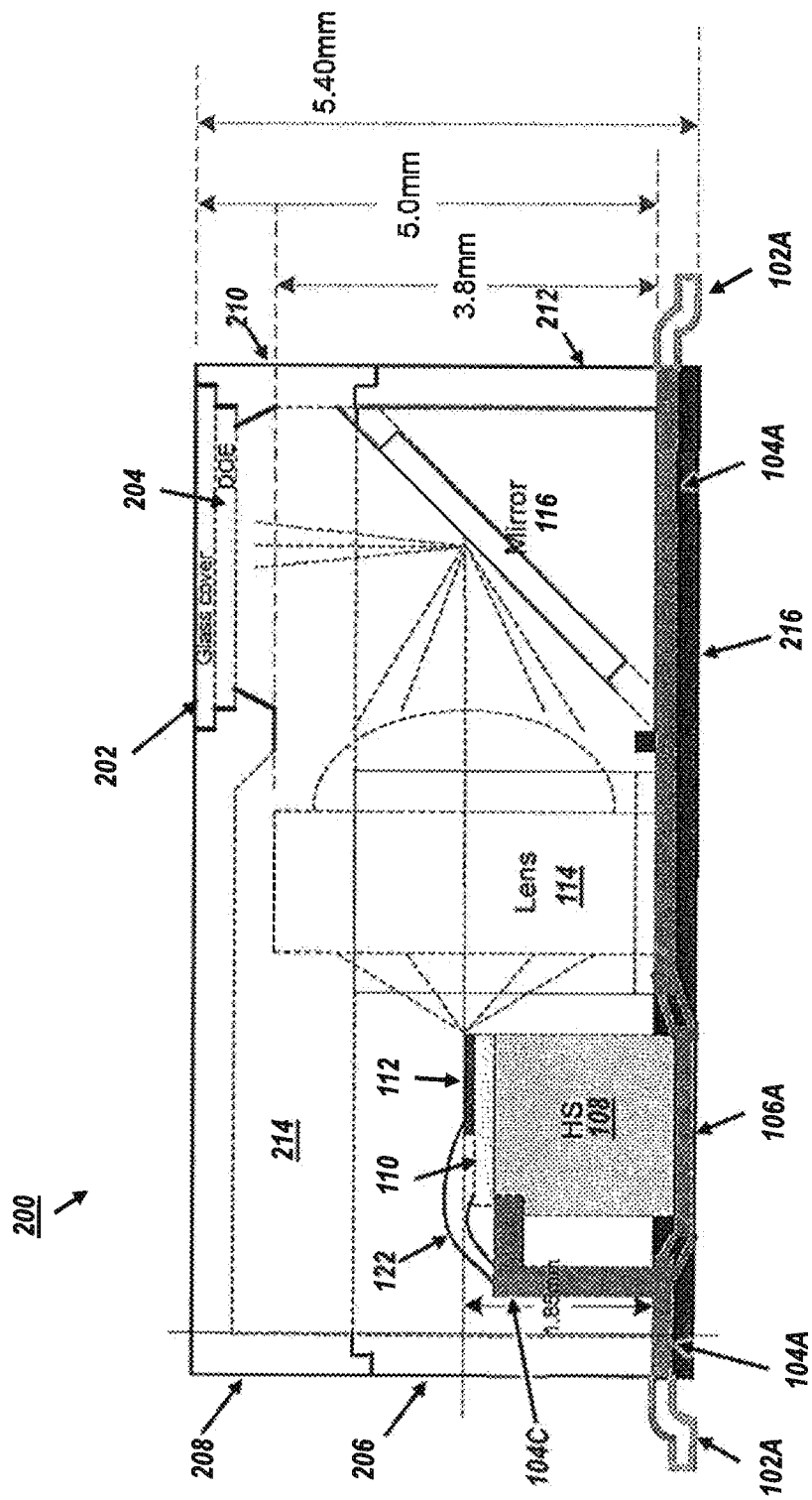
FIG. 2 shows a side view of a laser projection module comprising a lead frame, cover and laser projection components, where a heat sink component is located inside the cover under an illustrative embodiment.

FIG. 2 shows a side view of a laser projection assembly 200 comprising a lead frame having an outer lead frame portion 102A that lies outside of the cover walls 206, 212 and an inner lead frame portion 104A that lies inside the cover walls 206, 212. In the embodiment of FIG. 2, the laser projection assembly 200 is configured such that heat sink 108 resides inside a cavity area 214. In order to accommodate the heat sink 108, the inner lead frame portion 104A may comprise an extension 104C that may allow for more advantageous wire-bonding to the laser diode 112 and CoS portion 110. Inner lead frame portion 104A may be coupled to DAP portion 106A, which in this example is configured underneath heat sink 108 that is configured inside the cavity 214.

Lens 114 may be configured to pass light emission from laser diode 112 to mirror 116, for reflection outside the cover 120 of assembly 100 via a diffractive optical element 204 and optic cover 202, as shown in FIG. 2. In some illustrative embodiments, the optic cover or lens 202 comprises an optical glass. In other illustrative embodiments, the optical cover 202 may comprise a plastic or polymer material and may further include suitable optical coatings, depending on the optical application. The diffractive optical element 204 may be configured as a thin phase elements that operates by means of interference and diffraction to produce patterned or arbitrary distributions of light from mirror 116 and may be configured with binary and/or analog phase profiles. Diffractive optical element 204 may include, but is not limited to, diffractive lenses, beam splitters (spot arrays), diffractive diffusers, and corrector plates. Diffractive lenses can be used to reduce the number of elements in conventional lens systems and eliminate the need for exotic materials in correcting chromatic aberrations. Diffractive lenses may be configured as very thin elements with total depth height equal to $\lambda/(n-1)$, where $\lambda$ is the operating wavelength and n is the index of refraction. A diffractive lens may be composed of a series of zones that become finer towards the edge of the lens.

A beam splitter (or spot array) diffractive optical element 204 may be configured to split a laser beam from laser diode 112 into an array of spots. In this case, a generally collimated beam incident on the diffractive optical element 204 is separated into an array (e.g., 1D, 2D, etc.). The diffractive element that produces a beam splitter may be thought of as a grating configured with a predetermined shape that generates the desired distribution of spots. Diffractive diffuser elements (204) can also be used as diffusers to provide controlled illumination for certain specialized applications such as lithographic illumination systems. One advantage of diffractive diffusers (compared to refractive diffusers) is the sharp intensity fall-off, which is as wide as the diffraction-limited spot corresponding to the incident beam size at the operating wavelength. In some embodiments, a certain wavefront is required at some point of the optical system but, for whatever reason, the actual wavefront does not show the desired form. If the wavefront deviation from the ideal is consistent and repeatable, a corrector plate can be introduced in 204 to correct the wavefront by inducing the appropriate phase delay at various points of the aperture to produce the desired wavefront.

The diffractive optical element 204 and glass cover 202 may be mounted on top of ridges of a first top cover portion 208 and second top cover portion 210. In some illustrative embodiments, the first top cover portion 208 may be coupled to cover wall 206 and second top cover portion 210 may be coupled to cover wall 212. In other illustrative embodiments, the first top cover portion 208 and cover wall 206 may be integrated as a single cover portion, while second top cover portion 210 and cover wall 212 may be integrated as another single cover portion. The cover portions (206-210) may be coupled to a cover base 216 that may be integrated with inner lead frame portion 104A during the assembly process.

Figure 3:
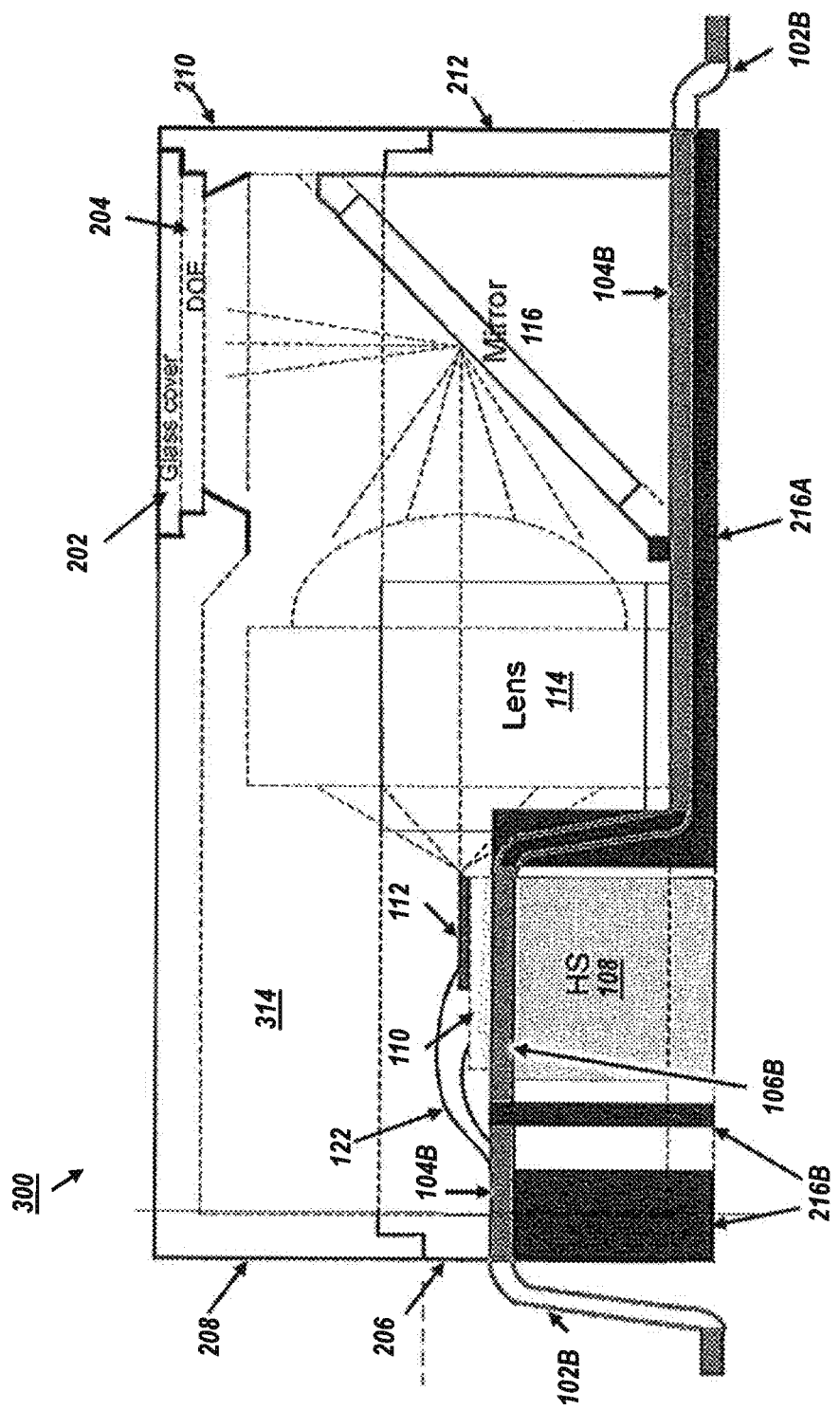
FIG. 3 shows a side view of a laser projection module comprising a lead frame, cover and laser projection components, where a heat sink component is located outside the cover under an illustrative embodiment.

Referring now to FIG. 3, an embodiment is shown for a laser projection assembly 300 that is similar to the embodiment of FIG. 2, except that the heat sink 108 is configured outside of the laser projection assembly cover, what may advantageously reduce potential heat buildup within cavity 314. As the heat sink 108 is elevated, the outer lead frame portion 102B is elevated to a point above the heat sink 108 for simplified wire bonding to the light diode assembly, and the inner lead frame portion 104B extends into the cavity 314 of the laser projection assembly 300 to DAP 106B, and back down to inner lead frame portion 104B in the cavity area housing the lens 114 and mirror 116. Similarly to FIG. 2, the inner lead frame portion 104B may be integrated with cover base 216 during the assembly process, and further comprise supports 216B for holding in place inner lead frame portion 104B that is coupled to the elevated outer lead portion 102B.

Figure 4:
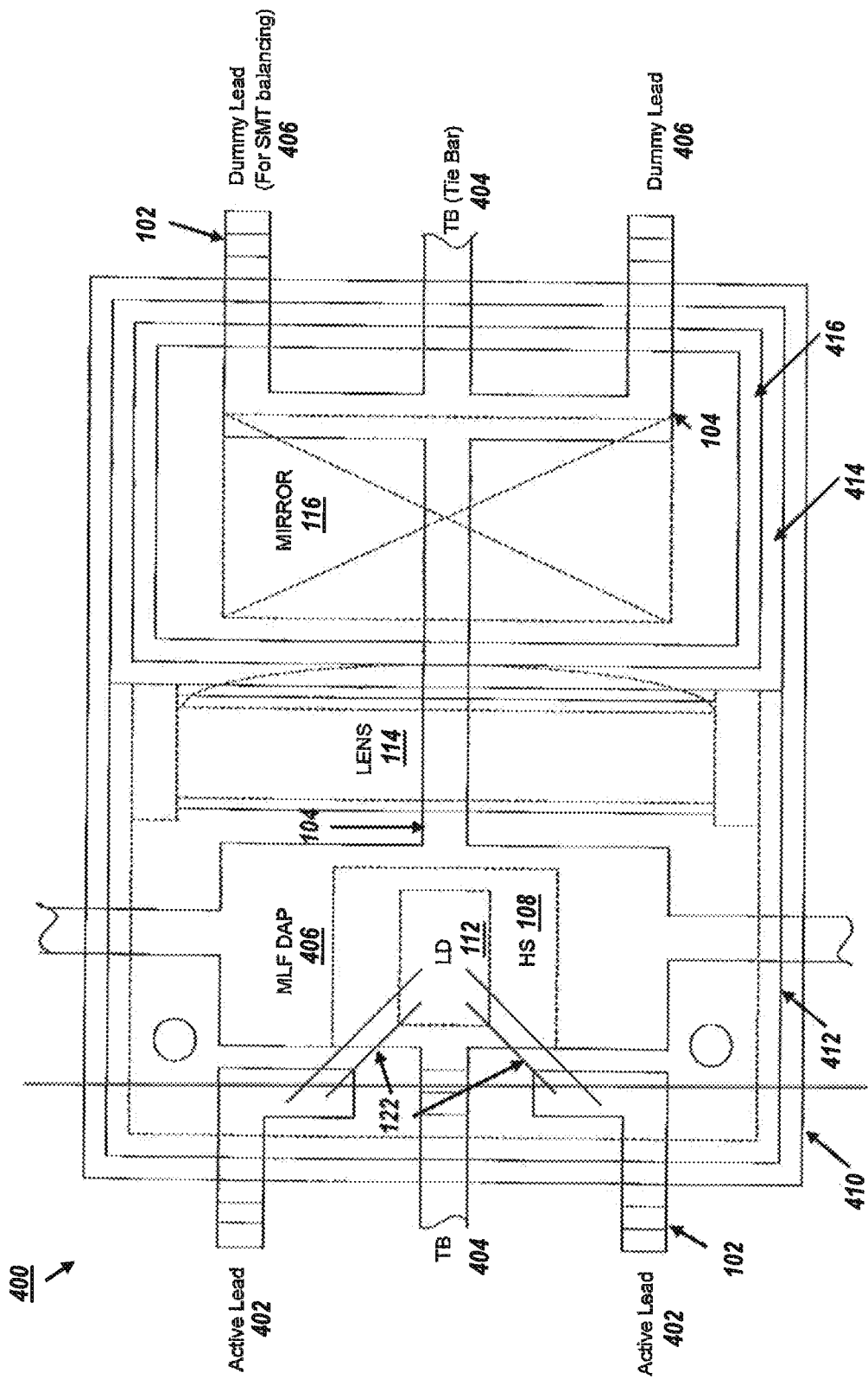
FIG. 4 shows a top view of a laser projection module and cover assembly, under an illustrative embodiment.

Referring now to FIG. 4, a top view is shown of a cover 410 for a laser projection assembly 400 under an illustrative embodiment. As in the previous embodiments, the laser projection assembly 400 comprises a lead frame having an outer lead frame portion 102 configured to operate with active leads (402), dummy leads (406) and tie bars 404 as shown to interconnect with a PCB. Those skilled in the art should appreciate that the dummy leads 406 for the lead frame (102, 104) may be configured to extend from one side of the laser projection assembly cover 410 (as in FIG. 4), or may extend from a plurality of sides of the laser projection assembly cover (as in FIG. 1; see dotted lines). As in the other embodiments, the outer lead frame portion 102 is coupled to inner lead frame portion 104, which is configured to electrically connect lens 114, mirror 116 and light diode assembly, which, in the example of FIG. 4, comprises metal lead frame die attach pad (MLF DAP) portion 406, overlaid by heat sink 108 and laser diode 112. In one embodiment, the MLF material may be comprised of copper having a thickness of 245-305 μm.

The cover 410 of FIG. 4 may be configured to have cover wall ledges that are advantageously configured to receive a top cover portion and other components. In the example of FIG. 4, a cover portion that is configured over the light diode assembly (108, 112, 406) and lens 114 may have a ridge 412 extending over at least two inner walls of cover 410 to seat and couple a top cover portion. The cover portion configured over the mirror 116 may have a first ridge 414 and a second ridge 416 extending over at least two inner walls of cover 410 to seat and couple an optical cover and a diffractive optical element.

Figure 5:
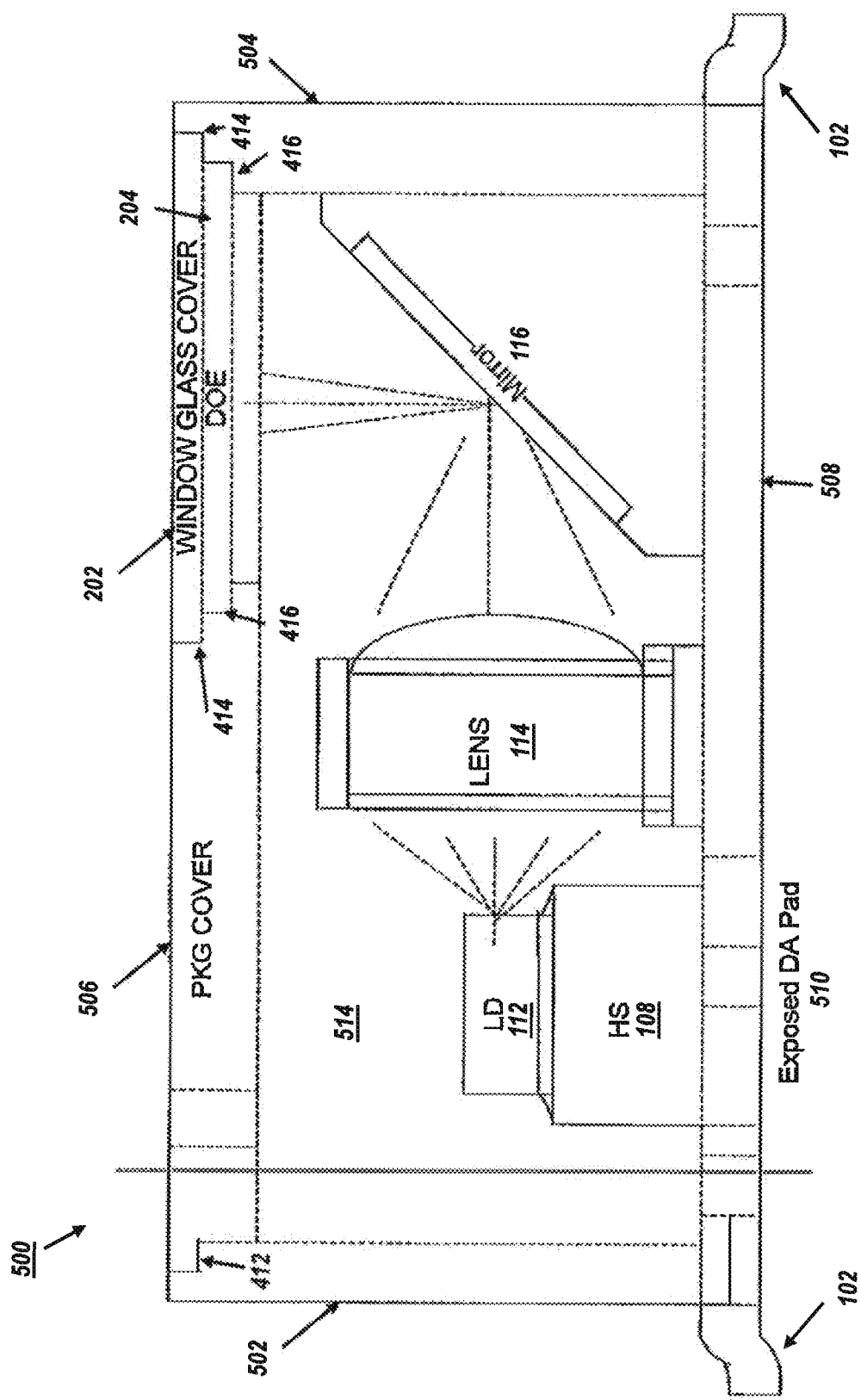
FIG. 5 shows a side view of the laser projection module and cover assembly of FIG. 4 under an illustrative embodiment.

FIG. 5 shows a side view 500 of the laser projection assembly of FIG. 4, where cover or housing 410 comprises a base cover 508 that supports cover walls 502-504. Cover wall 502 may comprise ledge 412 that is configured to house and couple top cover 506, which is fabricated to includes ledges 414, 416 that correspond to ledges 414, 416 of cover wall 504. As can be seen in the figure, the diffractive optical element 204 may be seated and coupled in ledge 416, and overlaid with optical cover 202 that is seated and housed in ledge 414.

The embodiment of FIG. 5 also comprises an exposed die attach pad 510, which is used in the example to provide access for electrical coupling to light diode 112 and related circuitry, due to the configuring of the heat sink 108 inside the cavity 514 of the laser projection assembly 500. In circumstances where the heat sink 108 is to be configured outside of the housing (e.g., see FIG. 3), the exposed die attach pad 510 would not be necessary.

Turning now to FIGS. 6A-6F, various illustrative embodiments are shown for a laser diode sub-mount 600 that may be coated in a positive electrode conductive film 602 and a negative electrode conductive film 604 as shown. In one embodiment, the conductive film may be less than 0.025 mm thick. The laser diode sub-mount 600 may be configured to couple the laser diode 112 that is wire bonded 122 as shown. In one embodiment, the laser diode sub-mount 600 may be made from aluminum nickel (AlNi), and plated with nickel-gold (NiAu). The laser diode sub-mount may be soldered with other components using a gold-tin (AuSn) solder (e.g., 80% gold, 20% tin). In one embodiment, laser diode sub-mount may be configured with vias 602 for facilitating electrical connection.

Figure 7:
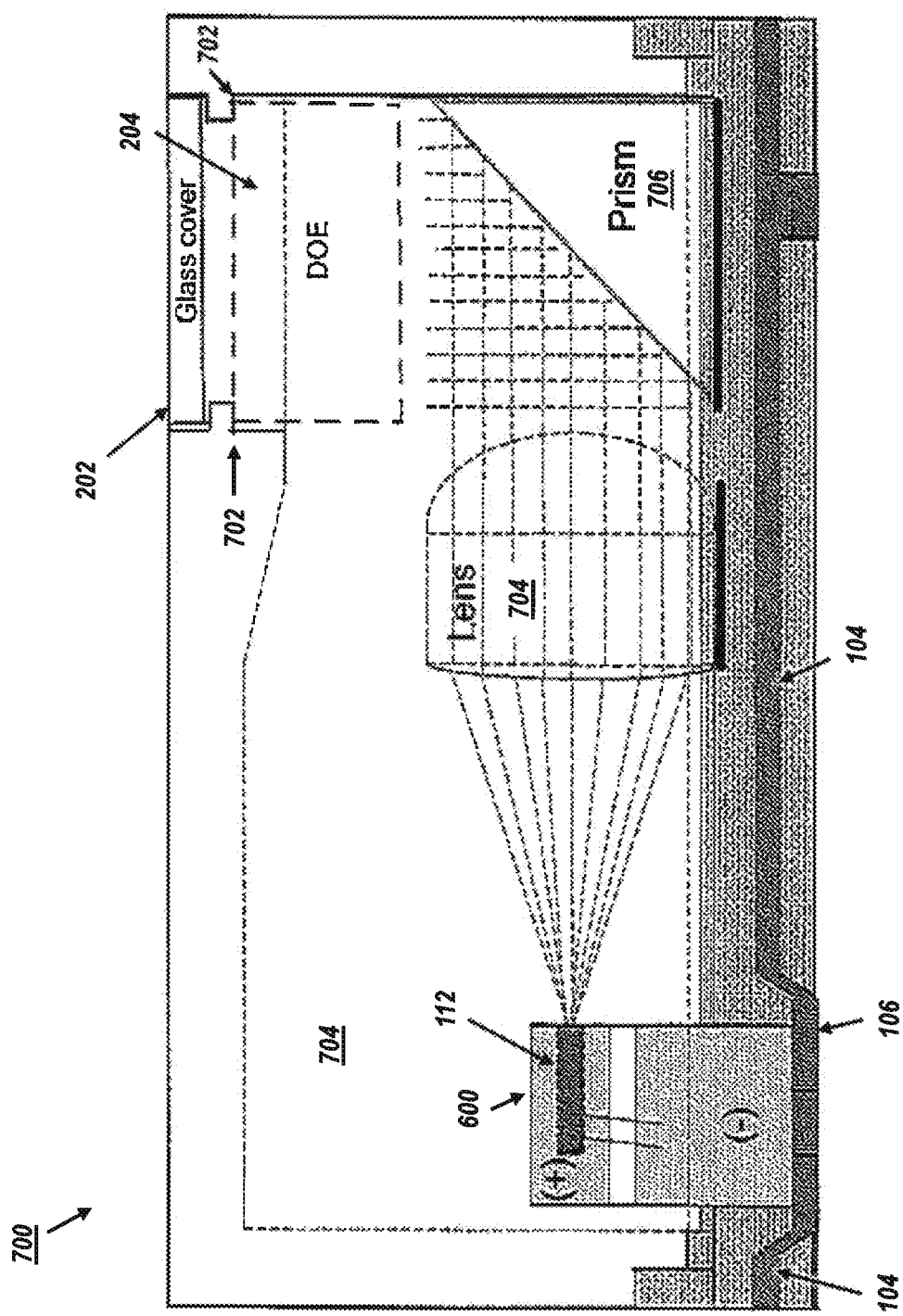
FIG. 7 shows a side view of a laser projection module utilizing a sub-mount together with a prism configuration under an illustrative embodiment.

Turning now to FIG. 7, an illustrative embodiment of a laser projection module assembly 700 is shown that comprises the laser diode sub-mount 600 with a mounted light diode 112 configured within a cavity 704 of the laser projection module assembly 700. The diode sub-mount 600 may be adhered to a DAP portion 106, or other suitable portion of lead frame 104, where illuminated light is passed through lens 704 to prism 706, which reflects light through diffractive optical element 204 and optical cover 202 to a region outside the laser projection module assembly 700.

In the embodiment of FIG. 7, the diffractive optical element 204 may be spaced from the optical cover 202. The space may be defined by a cover ledge 702 that separates the two elements, where the diffractive optical element 204 may be adhered to a bottom portion of the cover ledge 702, while the optical cover 202 is seated and coupled to a top portion of the cover ledge 702. The prism 706 may be configured as a transparent optical element with flat, polished surfaces that refract light. At least two of the flat surfaces of prism 706 have an angle between them, and may comprise a geometrical shape such as a triangular prism with a triangular base and rectangular sides. The prism 706 may be made from any material that is transparent to the wavelengths for which it is designed, and includes, but is not limited to, glass, plastic and fluorite.

Figure 8:
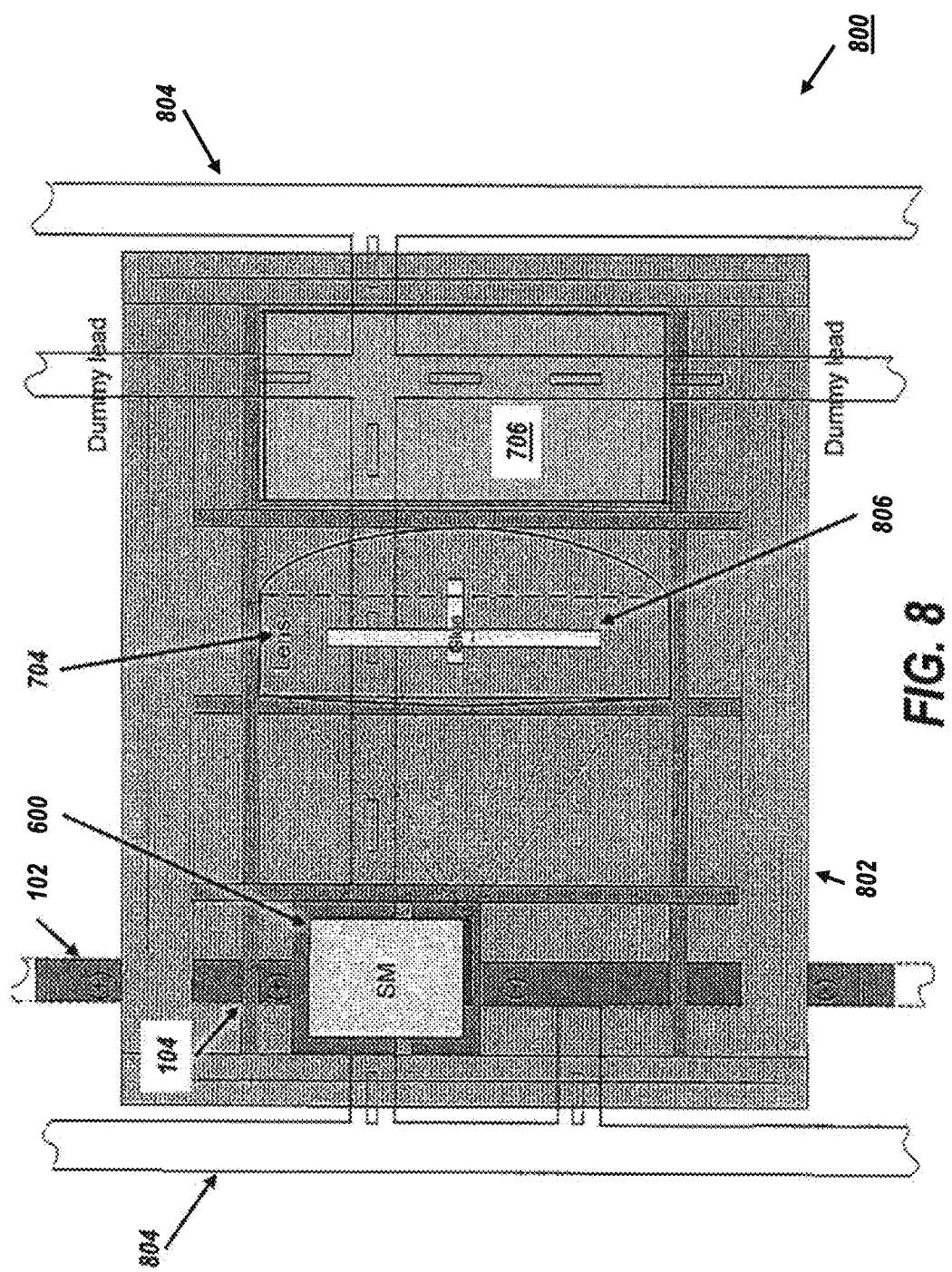
FIG. 8 shows a top view of a laser projection module utilizing a sub-mount together with a module lead frame and cover lead frame under an illustrative embodiment.

Referring to FIG. 8, a top view 800 of the laser projection module assembly of FIG. 7 is shown under an illustrative embodiment, where the laser sub-module 600 is coupled/affixed (e.g., surface mount, adhesive, etc.) in place along with the lens 704 that may be coupled/affixed using an adhesive in area 806, including, but not limited to, low-temp glue, snap-cure glue and/or UV cure glue. Also shown in the embodiment of FIG. 8 are the lead frames (102, 104) and cover lead frame 804, which will be discussed below in connection with FIGS. 9-10.

Figure 9:
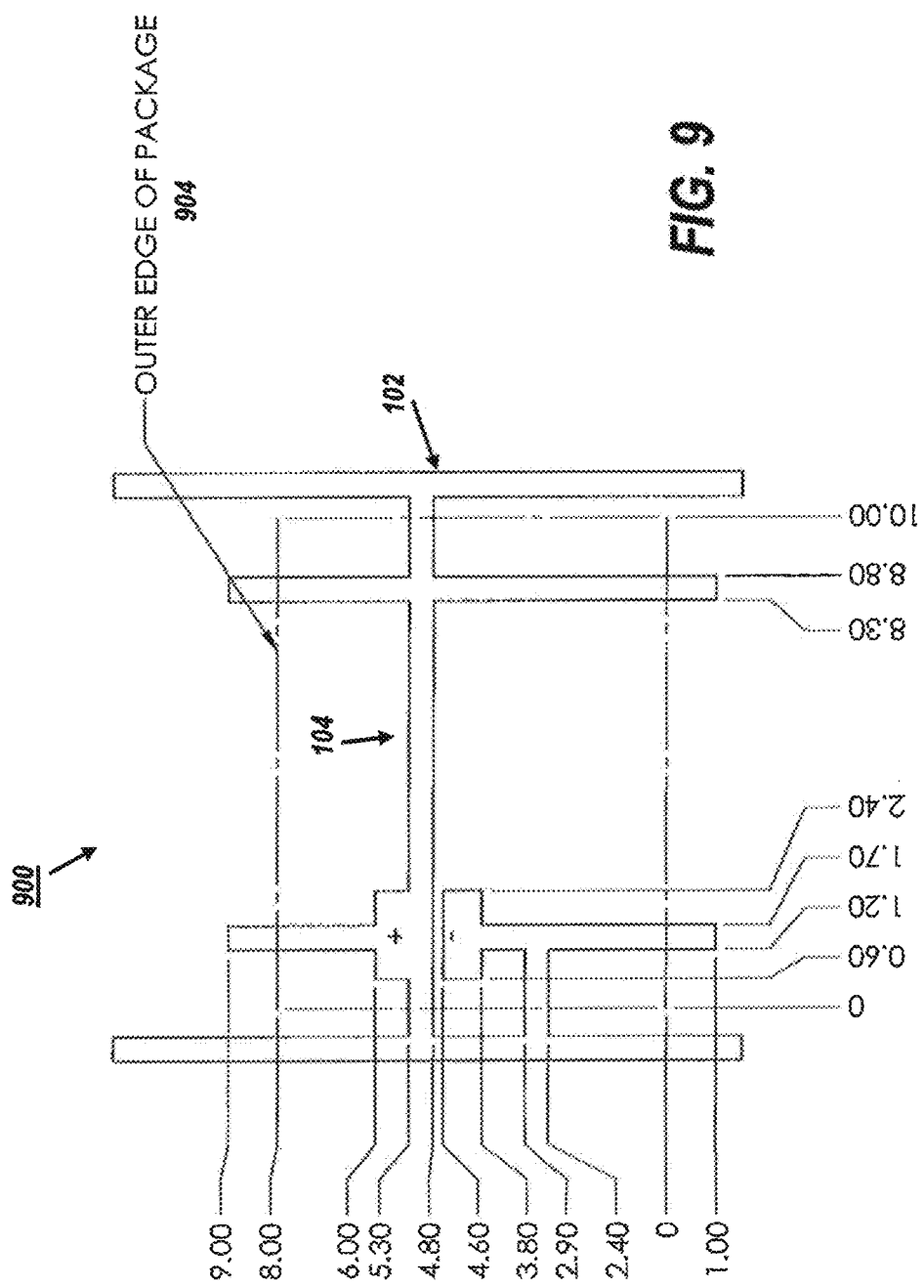
FIG. 9 shows a lead frame configured for use in a laser projection module under an illustrative embodiment.

FIG. 9 shows a lead frame 900, suitable for any of the embodiments disclosed herein, where a lead frame outer portion 102 may be defined as lead frame 900 portions that are configured outside the edge of the cover (or "package") 904, while the inner lead frame portion 104 may be defined as lead frame portions that are configured inside the edge of the cover (or "package") 904. As discussed above in connection with the embodiment of FIG. 1, the inner lead frame portion 104 may be formed having a meandering path in at least a part of the inner lead frame portion 104, and configured to receive and/or connect with light diode projection components. In some non-limiting and illustrative embodiments, the lead frame 900 may be formed from a suitable metal (e.g., copper) having a low coefficient of thermal expansion (CTE) and having a thickness of 10-12 mils (0.254-0.305 mm). In other illustrative embodiments, the lead frame may be formed from a palladium pre-plated material with a nickel-palladium-gold (NiPdAu) plating. The lead frame 900 may be configured as a single row, or comprising a plurality of rows. Those skilled in the art should understand that a multitude of configurations are contemplated in the present disclosure, and are not limited to the specific configurations disclosed herein.

Figure 10:
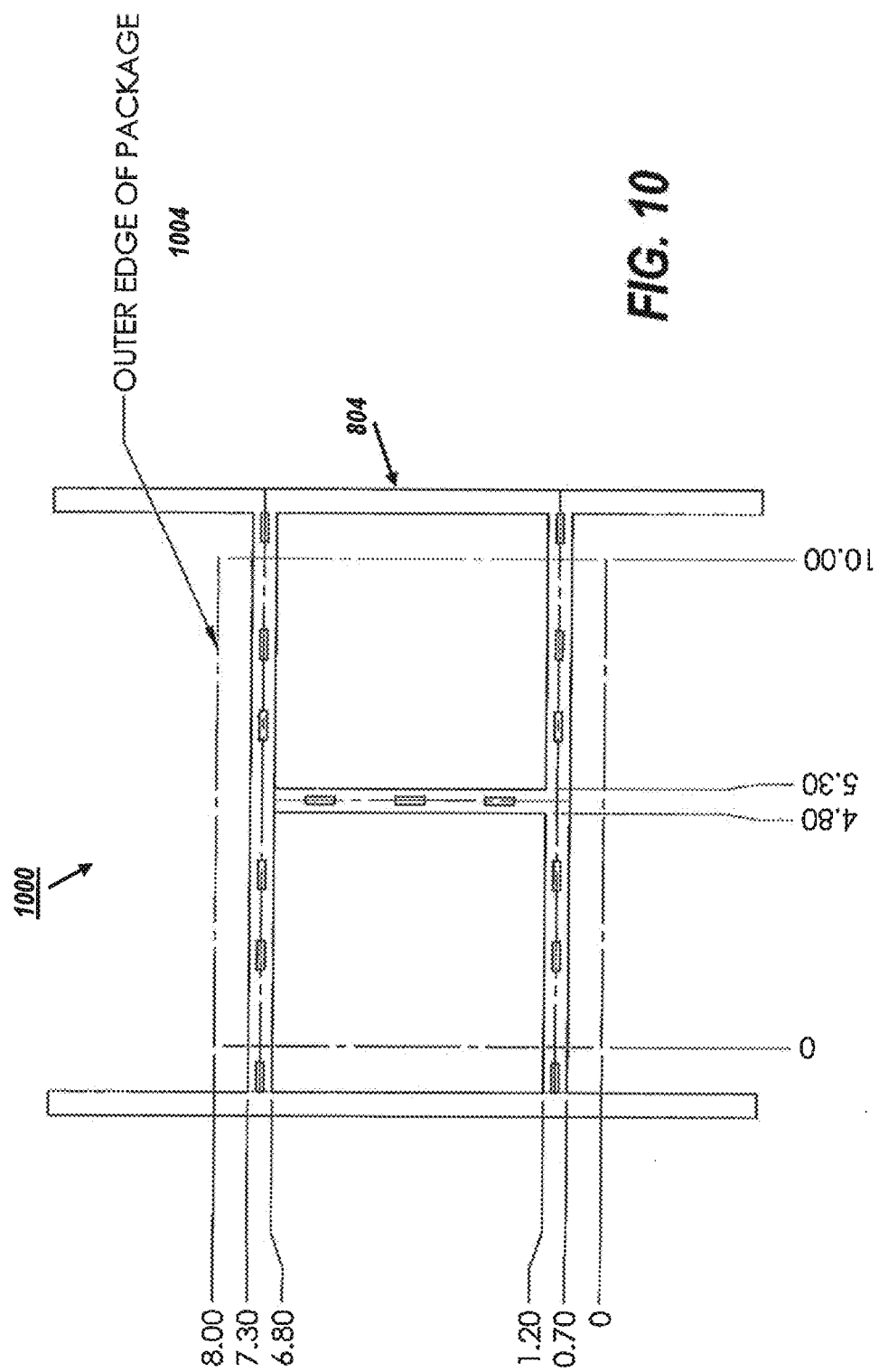
FIG. 10 shows a cover lead frame for use in a cover of a laser projection module under an illustrative embodiment.

FIG. 10 shows a cover lead frame 1000 that may be utilized in any of the embodiments disclosed herein. In some illustrative embodiments, the cover lead frame 100 may be used to secure a top cover portion (e.g., 208, 210). Similar to the lead frame of FIG. 9, cover lead frame 1000 may be formed from a suitable metal (e.g., copper) having a low coefficient of thermal expansion (CTE) and having a thickness of 10-12 mils (0.254-0.305 mm). In other illustrative embodiments, the lead frame may be formed from a palladium pre-plated material with a nickel-palladium-gold (NiPdAu) plating. The lead frame 1000 may be configured as a single row, or comprising a plurality of rows. Those skilled in the art should understand that a multitude of configurations are contemplated in the present disclosure, and are not limited to the specific configurations disclosed herein.

Figure 11:
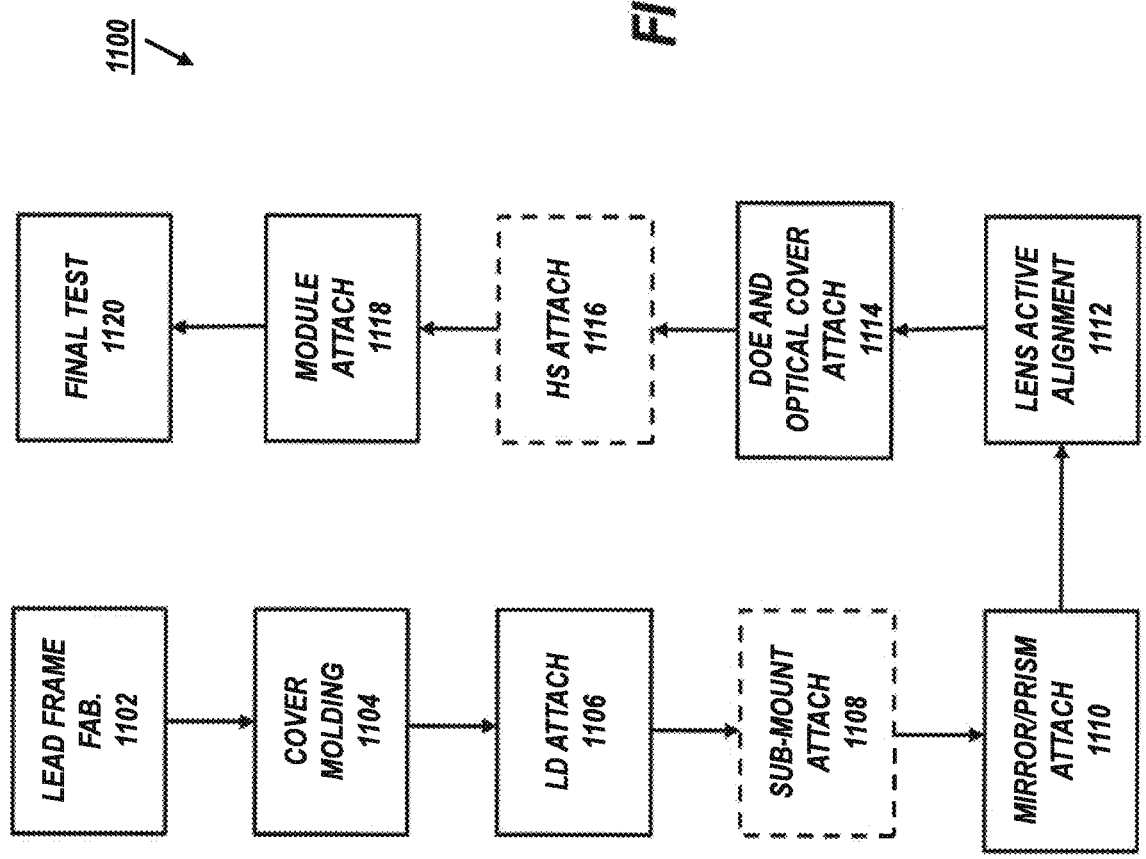
FIG. 11 shows a method for assembling a laser projection module under an illustrative embodiment.

Referring now to FIG. 11, an illustrative method 1100 is disclosed for fabricating a laser projection module under an embodiment. The method may begin at block 1102, where the lead frames (e.g., 900, 1000) are fabricated and incorporated during the cover molding performed in block 1104. The cover molding may be performed using plastic to define an open cavity cover, in which the lead frames may be coupled into the cover molding. In block 1106, the light diode (e.g., 112) may be attached and assembled. In circumstances where a sub-mount is not used, the light diode (e.g., 112) may be assembled to a chip on sub-mount (CoS) portion (e.g., 110), heat sink (e.g., 108) and a die attach pad (DAP) portion (e.g., 106). The order of these components may depend on whether the heat sink (e.g., 108) will be configured to be inside or outside the cavity of the cover (e.g., see FIGS. 2 and 3). The light diode assembly may be coupled using a thermally conductive epoxy or other suitable material and wirebonded.

In the event a laser diode sub-mount (e.g., 600) is used, the sub-mount may first be coupled to the lead frame and cover in block 1108, followed by attachment of the laser diode (e.g., 112). In block 1110, the mirror or prism is attached to the module using non-conductive glue, followed by lens attachment and active alignment in block 1112. One technique that may be used for active alignment comprises mechanical alignment, where a lens cell and the lens itself may be produced with relatively tight diameter tolerances. The gap between the housing cell wall and the outer diameter of the lens may be designed for a minimal separation. The lens is then normally centered within the housing, with a plurality (e.g., three) equal-thickness shims are inserted between the cell wall and the lens. Adhesive may be applied and once the adhesive sets up, the shims are normally removed from the assembly.

Alternatively or in addition, the lens can be held in place with hardware such as retaining rings. The mechanical alignment method relies on the inherent tolerances of the optic and the mechanics, including the shims and the centration process, to accomplish this assembly technique. Spot curing the lens in place with a UV-curable adhesive in block 904 and then performing the final bond with either RTV room-temperature vulcanizing or a thermal-cure adhesive may be performed.

In other illustrative embodiments, active lens alignment in block 1112 may comprise optical alignment, where the lens is inserted into the lens cell, and the position is moved into place actively by monitoring either the lens surface's reflected return or the transmitted return. In reflection, the center of curvature from the lens surface may be used. An autocollimator may be used to provide the optical return. In transmission, it is the lens's focal point. In some illustrative embodiments, increased accuracy may be obtained by incorporating a Fizeau interferometer and monitoring the fringe pattern. In some illustrative embodiments, the active alignment software may be optimized to align the lens, and, by adjusting the position of the lens on its mounting surface, the optical axis can be fine-tuned relative to the cell's mechanical axis. Unlike the mechanical alignment method, the active optical method has less need for certain component attributes to be held to very tight tolerances.

Once the lens is aligned and cured the diffractive optical element (e.g., 204) and optical cover (e.g., 202) are attached. The diffractive optical element and optical cover may be coupled using a non-conductive glue. Depending on the heat sink (e.g., 108) configuration used, the heat sink may be attached in block 1116 to a die attach pad (e.g., 106) using a solder or thermally conductive epoxy, or other suitable material. In block 1118, the laser projection module may be attached by soldering (e.g., laser solder with multiple sensor heads) or otherwise suitably coupling the laser projection module to a PCB, where it may undergo final testing in block 1120.

Figure 12:
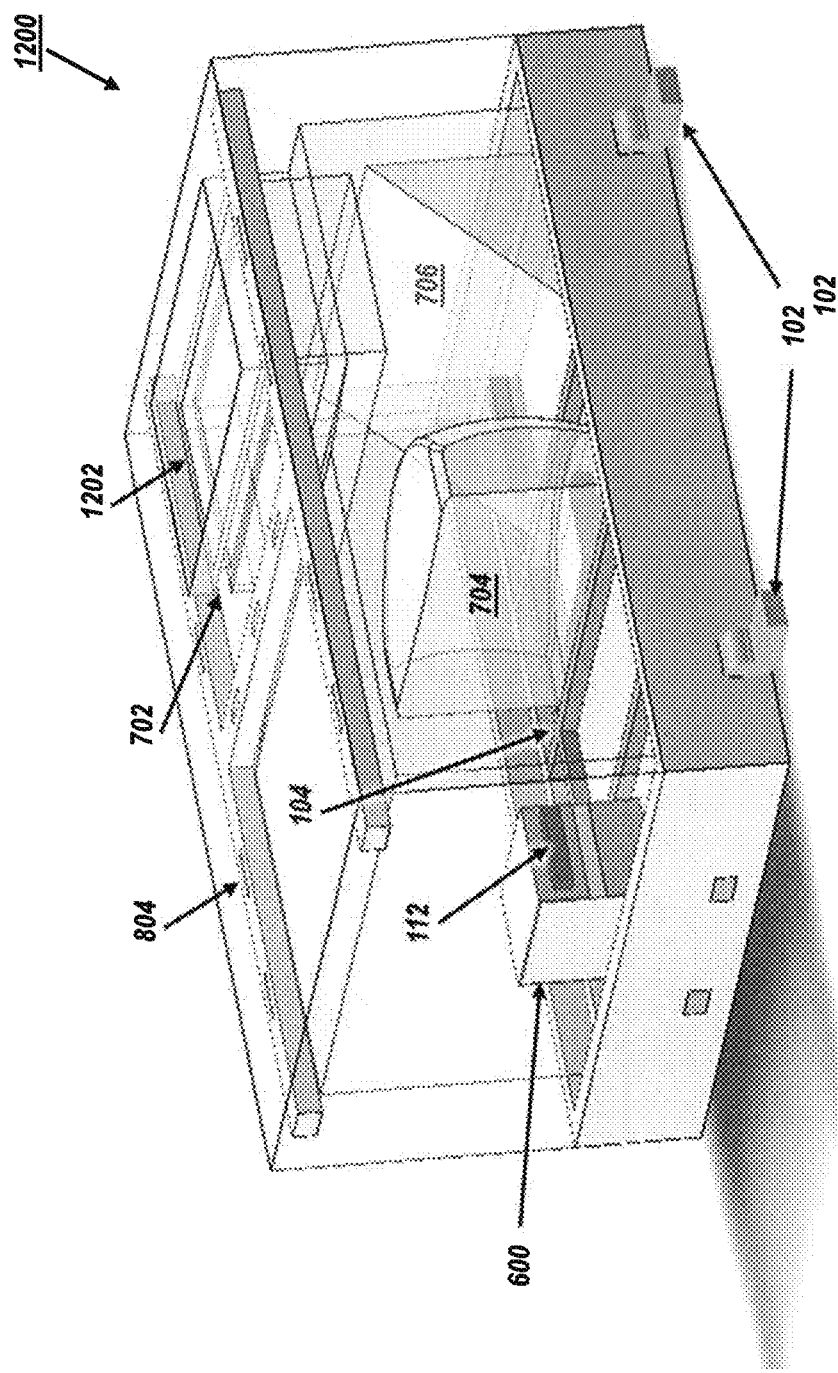
FIG. 12 shows a three-dimensional perspective view of an assembled laser projection module under an illustrative embodiment.

FIG. 12 shows a three-dimensional perspective view of an assembled laser projection module 1200 under an illustrative embodiment. The laser projection module 1200 in the example may be assembled from the illustrative configurations shown above with respect to FIGS. 7-8. In the example, the diffractive optical element (e.g., 204) may be spaced from the optical cover (e.g., 202) utilizing the cover ledge 702 that separates the two elements. The prism 706 may be configured as a transparent optical element with flat, polished surfaces that refract light. The laser sub-module 600 is coupled/affixed (e.g., surface mount, adhesive, etc.) in place along with the lens 704 that may be coupled/affixed using an adhesive that includes, but is not limited to, low-temp glue, snap-cure glue and/or UV cure glue. Also shown in the embodiment of FIG. 12 are the lead frames (102, 104) and cover lead frame 804, which was discussed above.

It can be appreciated by those skilled in the art that the present disclosure provides various advantageous configurations for a light projection module having a relatively low z-height (e.g., <6 mm) that may be easier to manufacture and thus provide a faster cycle time, lower equipment cost, better laser safety, better connectivity of active parts, and higher reliability. Some advantageous features may be achieved by using a substrate as a base plate and placing/aligning elements on the base plate. The active elements then may be connected to the base plate to form a light projection module, where the module may simply be connected to a PCB. Also, while some embodiments herein illustrate the light projection module cover as having a generally rectangular shape, those skilled in the art should appreciate that any suitable three-dimensional shape may be used.

In the foregoing detailed description, it can be seen that various features are grouped together in individual embodiments for the purpose of brevity in the disclosure. This method of disclosure is not to be interpreted as reflecting an intention that the subsequently claimed embodiments require more features than are expressly recited in each claim.

Further, the descriptions of the disclosure are provided to enable any person skilled in the art to make or use the disclosed embodiments. Various modifications to the disclosure will be readily apparent to those of ordinary in the pertinent art, and the generic principles defined herein may be applied to other variations without departing from the spirit or scope of the disclosure. Thus, the disclosure is not intended to be limited to the examples and designs described herein, but rather are to be accorded the widest scope consistent with the principles and novel features disclosed herein. That is, the claims which follow are to be accorded their respective broadest scope in light of the exemplary disclosure made herein.

What is claimed is:

1. A laser projection module, comprising:
a laser projection module cover comprising a top portion, a bottom portion and a one or more of side portions to define a cavity within the cover, wherein the cavity is configured to couple an optical lens to reflect out of the top portion of the laser projection module cover;
a cover lead frame, at least partially integrated into the bottom portion of the laser projection module cover, the cover lead frame comprising an outer lead frame portion and an H-shaped inner lead frame portion relative to the laser projection module cover, wherein the H-shaped inner lead frame portion is configured to electrically couple to a laser diode assembly physically offset to one side of the H-shape of the inner lead frame portion within the cavity such that laser light from the laser diode assembly passes through a refractive lens centrally physically coupled to the H-shape of the inner lead frame portion for reflection from the optical lens associated with the H-shape distally from the laser diode assembly, the cover lead frame being configured to be physically coupled to at least the bottom portion of the laser projection module cover.

2. The laser projection module of claim 1, wherein the laser diode assembly comprises a laser diode, a chip on sub-mount portion, a heat sink and a die attach pad portion.

3. The laser projection module of claim 2, wherein the laser diode assembly is wire bonded to the inner lead frame portion.

4. The laser diode projection module of claim 2, wherein the heat sink of the laser diode assembly is configured to be outside of the laser projection module cover.

5. The laser diode projection module of claim 4, wherein the die attach pad portion comprises an exposed portion.

6. The laser diode projection module of claim 2, wherein the heat sink of the laser diode assembly is configured to be within the cavity of the laser projection module cover.

7. The laser projection module of claim 1, wherein the laser diode assembly comprises a laser diode coupled to a laser diode sub-mount coupled to a die attach pad portion within the cavity of the cover.

8. The laser projection module of claim 1, further comprising a diffractive optical element physically coupled to the laser projection module cover substantially above and optically coupled to the optical lens for the reflecting.

9. The laser projection module of claim 8, wherein the diffractive optical element comprises one of a diffractive lens, a beam splitter, a diffractive diffuse and a corrector plate.

10. The laser projection module of claim 1, further comprising a secondary lens; optically physically coupled to the laser projection module cover substantially above and optically coupled above to the optical lens.

11. The laser projection module of claim 10, further comprises a mirror, configured to receive light emission from the secondary lens.

12. The laser projection module of claim 1, wherein the refractive lens comprises a prism.

13. The laser projection module of claim 1, wherein the cover lead frame comprises at least one active lead, at least one dummy lead and a tie bar.

\* \* \* \* \*